(12) United States Patent
Lee

(10) Patent No.: US 7,751,247 B2
(45) Date of Patent: Jul. 6, 2010

(54) METHOD AND APPARATUS FOR TRIMMING REFERENCE VOLTAGE OF FLASH MEMORY DEVICE

(75) Inventor: Yong-Seop Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 76 days.

(21) Appl. No.: 11/933,659

(22) Filed: Nov. 1, 2007

(65) Prior Publication Data

US 2008/0123403 A1    May 29, 2008

(30) Foreign Application Priority Data

Nov. 27, 2006    (KR) ...................... 10-2006-0117376

(51) Int. Cl.
*G11C 16/04*    (2006.01)
(52) U.S. Cl. ................................ 365/185.2; 365/185.18
(58) Field of Classification Search .............. 365/185.2, 365/185.18, 185.33, 185.09, 189.09
See application file for complete search history.

(56) References Cited

U.S. PATENT DOCUMENTS

| | | | | |
|---|---|---|---|---|
| 5,459,684 A | * | 10/1995 | Nakamura et al. | ........... 365/149 |
| 5,642,310 A | * | 6/1997 | Song | ...................... 365/185.29 |
| 6,373,256 B1 | * | 4/2002 | Hanjani et al. | ............... 324/433 |
| 6,559,627 B2 | * | 5/2003 | Khouri et al. | ................ 323/282 |
| 6,785,163 B2 | * | 8/2004 | Yeh et al. | ................... 365/185.2 |
| 7,072,238 B2 | * | 7/2006 | Chae et al. | ................... 365/226 |
| 2001/0014035 A1 | | 8/2001 | Briner | |

* cited by examiner

*Primary Examiner*—Vu A Le
(74) *Attorney, Agent, or Firm*—Sherr & Vaughn, PLLC

(57) ABSTRACT

The present invention relates to a method and apparatus for trimming a reference voltage. The method may include at least one steep of performing an erase operation of a flash memory resistor; performing a program operation of the flash memory resistor; performing a current read operation of the flash memory resistor; confirming the threshold voltage of the flash memory resistor by measuring the current flowing into a drain of the flash memory resistor; determining whether the threshold voltage of the flash memory resistor satisfies a reference voltage; and then completing the trimming operation if the threshold voltage of the flash memory resistor satisfies the reference voltage.

19 Claims, 8 Drawing Sheets

METHOD AND APPARATUS FOR TRIMMING REFERENCE VOLTAGE OF FLASH MEMORY DEVICE

This application claims the benefit of Korean Patent Application No. 10-2006-0117376, filed on Nov. 27, 2006, which is hereby incorporated by reference as if fully set forth herein.

BACKGROUND

In flash memory devices, the value of an internal voltage used for erasing and/or programming may be adjusted using a reference voltage. Because the reference voltage may be variable depending on the change in temperature, an external power supply, and a process, the reference voltage may be trimmed by a method using a fuse in order to adjust the reference voltage.

Figure 1:
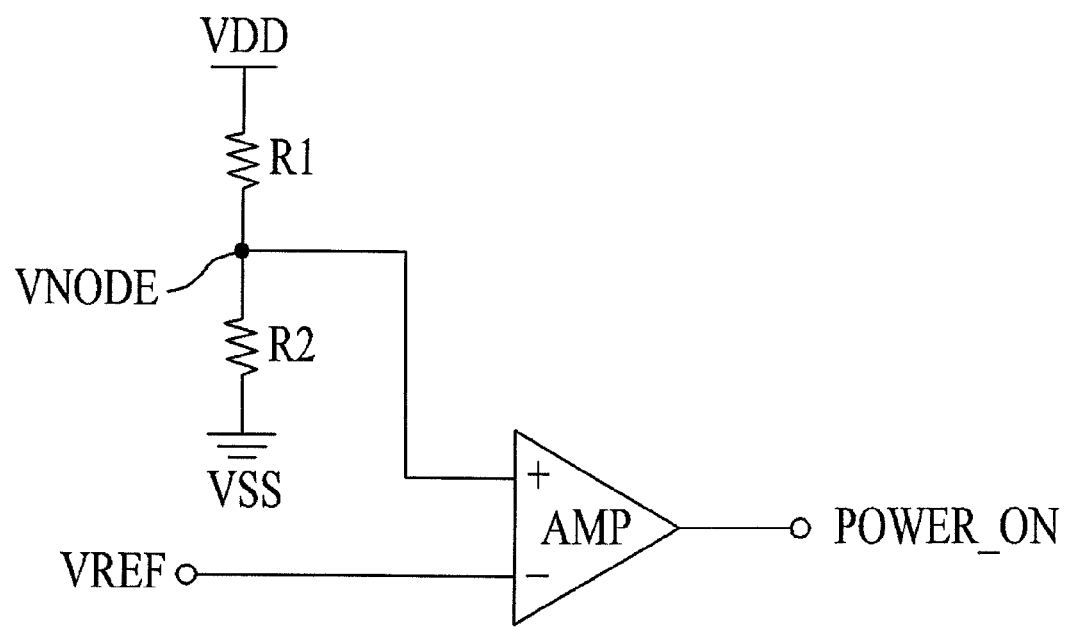

As illustrated in example FIG. 1, a circuit for detecting a reference voltage may include first resistor R1, second resistor R2 dividing reference voltage VREF and system voltage VDD and amplifier AMP comparing reference voltage VREF with node voltage VNODE. Amplifier AMP may output an output voltage in a "low" state if node voltage VNODE divided by first resistor R1 and second resistor R2 depending on system voltage VDD is lower than reference voltage VREF. Amplifier may output an output voltage in a "high" state if node voltage VNODE is increased depending on the increase of system voltage VDD.

However, node voltage VNODE may be varied depending on the resistance values of first resistor R1 and second resistor R2. In essence, the resistance values of first resistor R1 and second resistor R2 may be varied depending on system voltage VDD and process conditions in the semiconductor manufacturing process so that the precision of the voltage detection may be degraded due to the change in node voltage VNODE.

Figure 2:
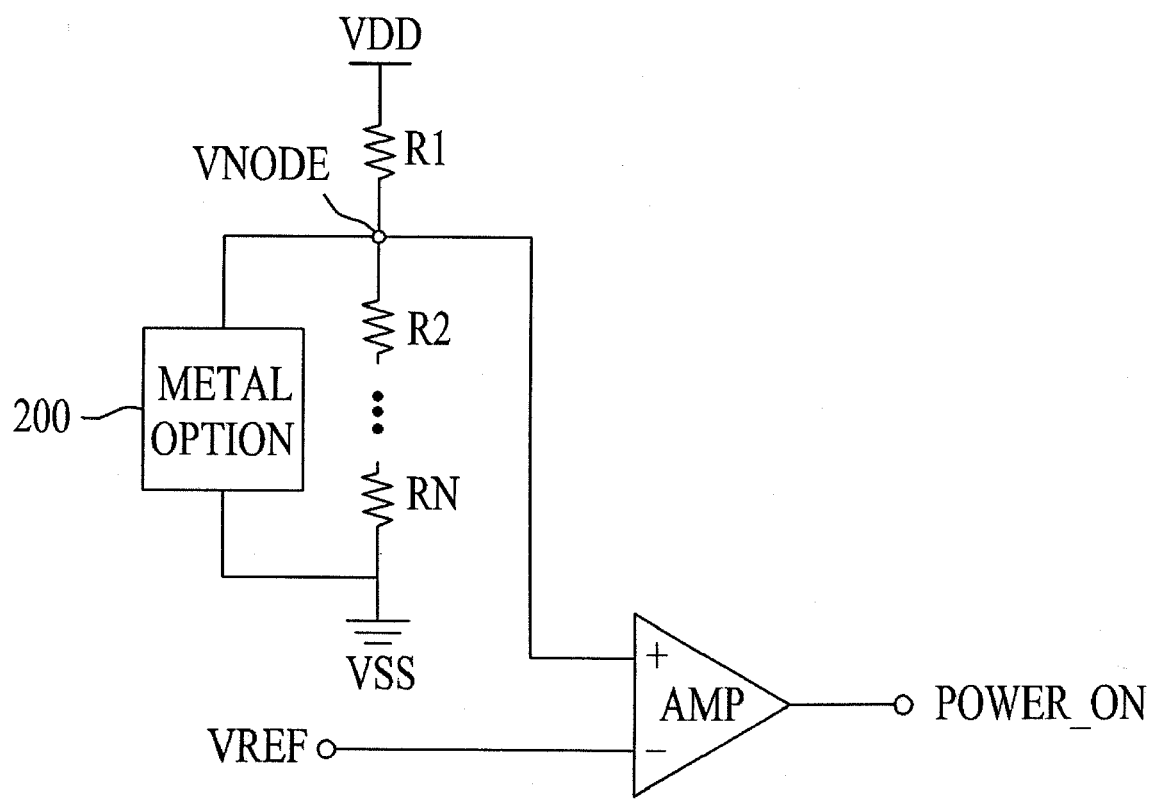

As illustrated in example FIG. 2, in order to overcome such problems a circuit for detecting the reference voltage using a plurality of resistors and a metal option has been proposed. The characteristics of a flash memory device may be tested using a plurality of resistors and metal option 200, whereby a corrected metal layer may be employed. However, precision may be degraded due to the change in the process conditions and system voltage VDD as well as the change in the characteristics for every lot and for every chip.

Accordingly, although the trimming may be made to conform to the characteristics for every chip using metal option 200 including a poly fuse and a metal fuse, a separate laser cutting apparatus may be required after testing. When an electrical fuse is used, a defect chip may be generated by a fragment due to a blown fuse, and trimming work cannot be fully conducted after completing the trimming so that the flexibility of production is degraded.

While a small resistor has been used in the semiconductor process, a large resistor may be required in order to minimize power consumption. Therefore, in order to make a resistor with a large value, the resistor occupies a considerable portion of a chip size. In particular, when a circuit requiring a plurality of resistors is added, the number of chips producible per a unit area unit area is reduced.

SUMMARY

Embodiments relate to an apparatus for trimming a reference voltage of a flash memory device insensitive to the change in a drain voltage and process conditions in a semiconductor process.

Embodiments relate to an apparatus for trimming a reference voltage of a flash memory device that may include a circuit for trimming a reference voltage including a resistor dividing a drain voltage, a flash memory resistor formed of a flash memory, an NMOS turning on/off the drain of the flash memory, and an amplifier comparing the reference voltage and a node voltage; an NMOS gate switch turning on/off the NMOS; a flash cell gate switch switching the gate voltage of the flash memory when the flash memory is in program, erase, and resistance states; a flash cell source switch switching the source voltage of the flash memory for the erase operation of the flash memory; and a flash cell drain switch switching the drain voltage of the flash memory for the program operation of the flash memory.

Embodiments relate to a method for trimming a reference voltage of a flash memory device using a resistor formed of a flash memory including at least one of the following steps: performing an erase operation of flash memory resistor; performing a program operation of the flash memory resistor; performing a read operation of the current of the flash memory resistor; confirming the threshold voltage of the flash memory resistor by measuring the current flowing into the drain of the flash memory resistor; determining whether the threshold voltage of the flash memory resistor satisfies the reference voltage; and completing the trimming operation if the threshold voltage of the flash memory resistor satisfies the reference voltage.

DRAWINGS

Example FIGS. 1 and 2 illustrate circuit diagrams showing a circuit for detecting a reference voltage of a flash memory device.

Figure 3:
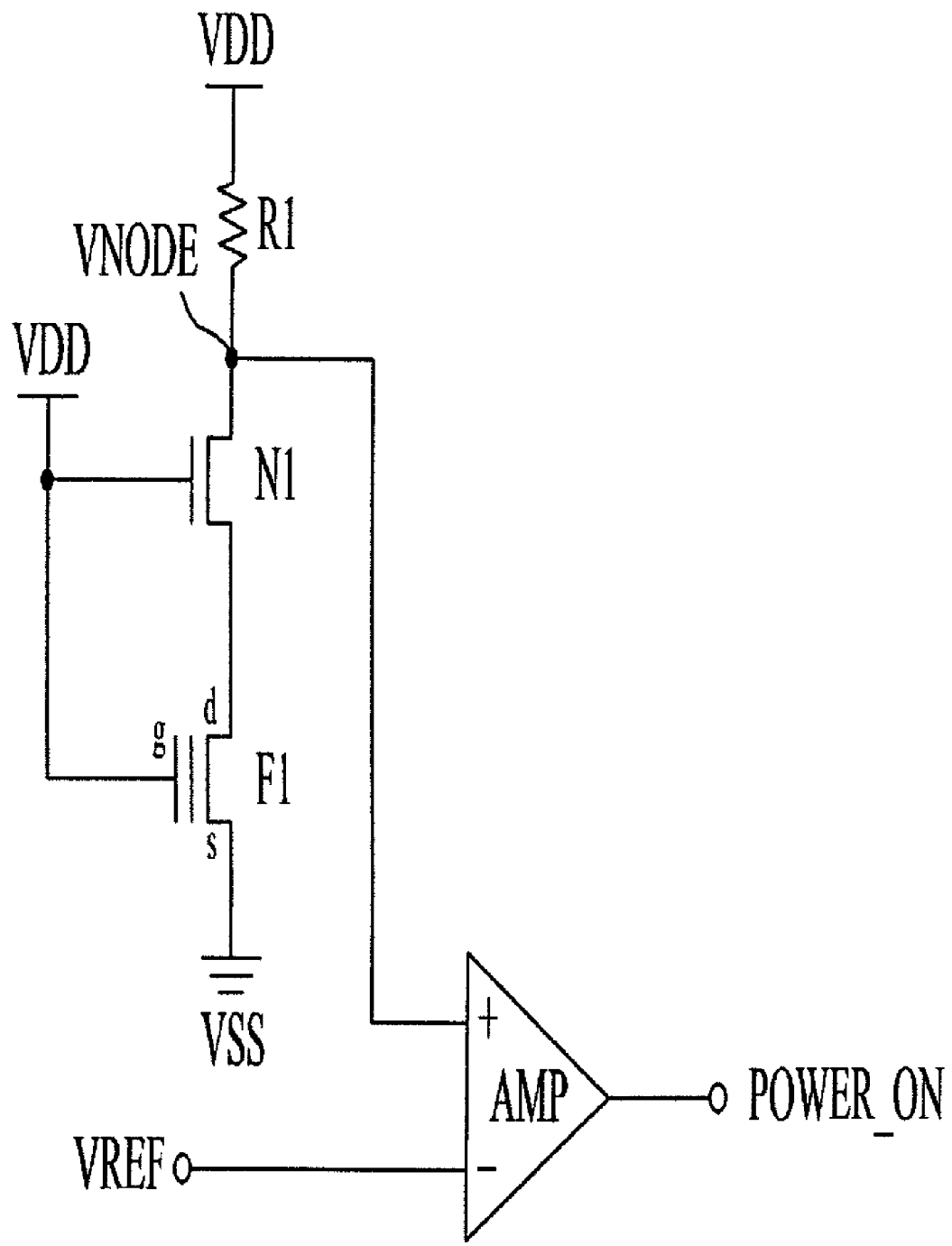
Figure 4:
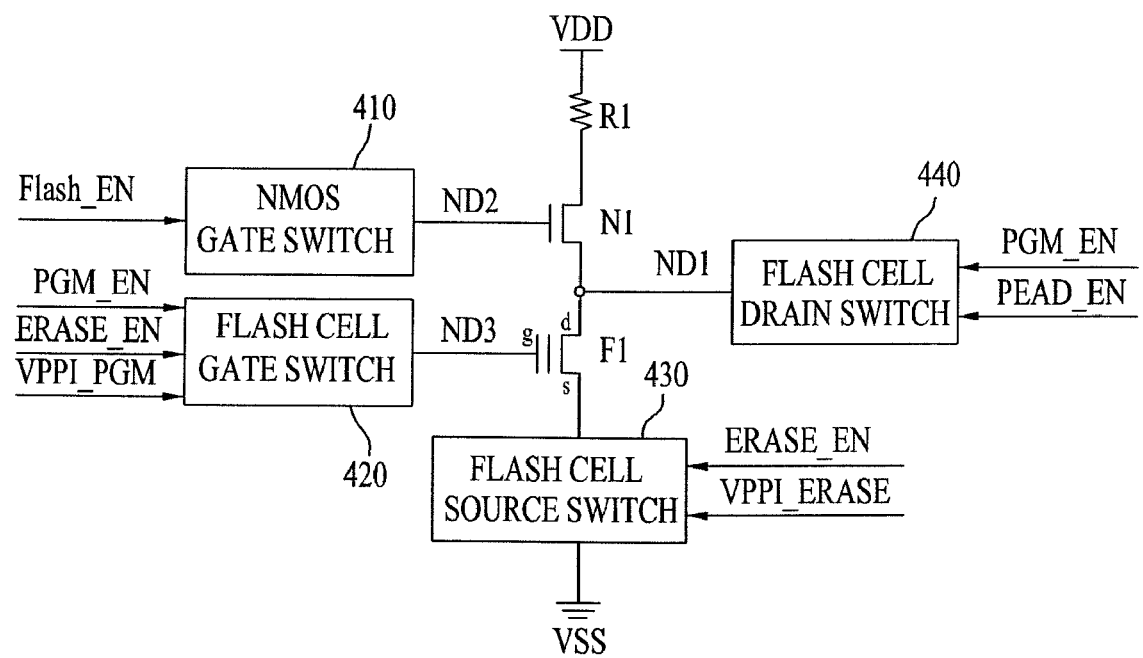

Example FIGS. 3 and 4 illustrate circuit diagrams for trimming a reference voltage of a flash memory device, in accordance with embodiments.

Figure 5:
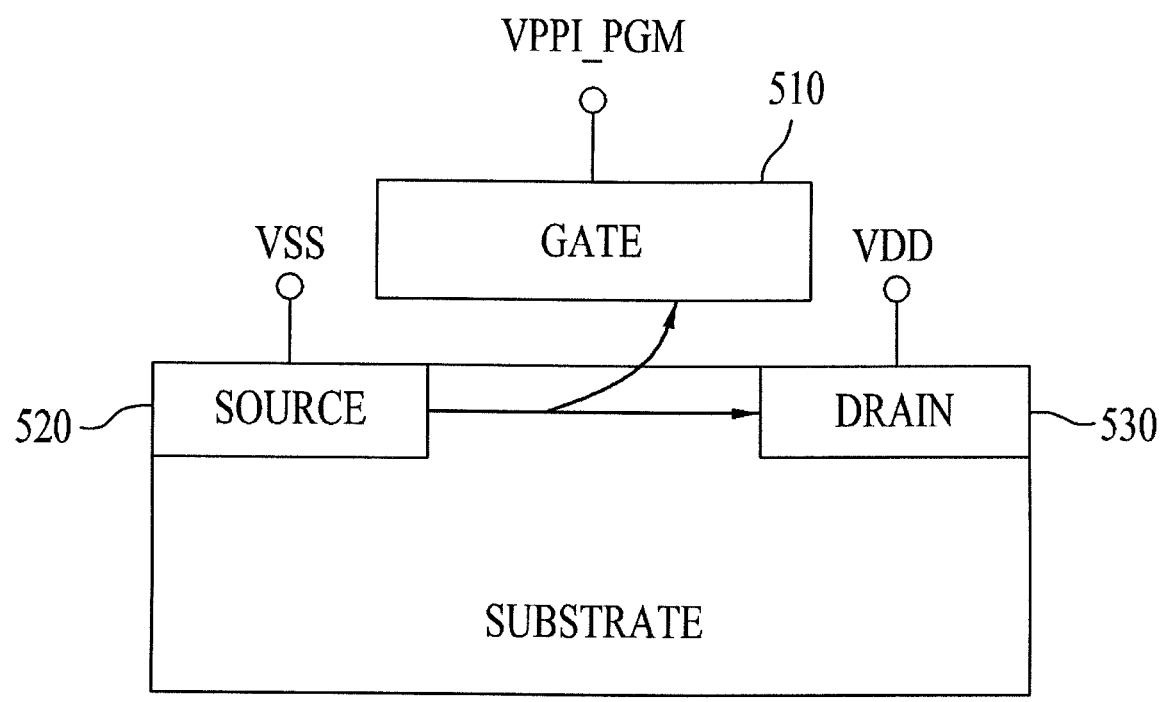

Example FIG. 5 illustrates a flash memory device in a program state, in accordance with embodiments.

Figure 6:
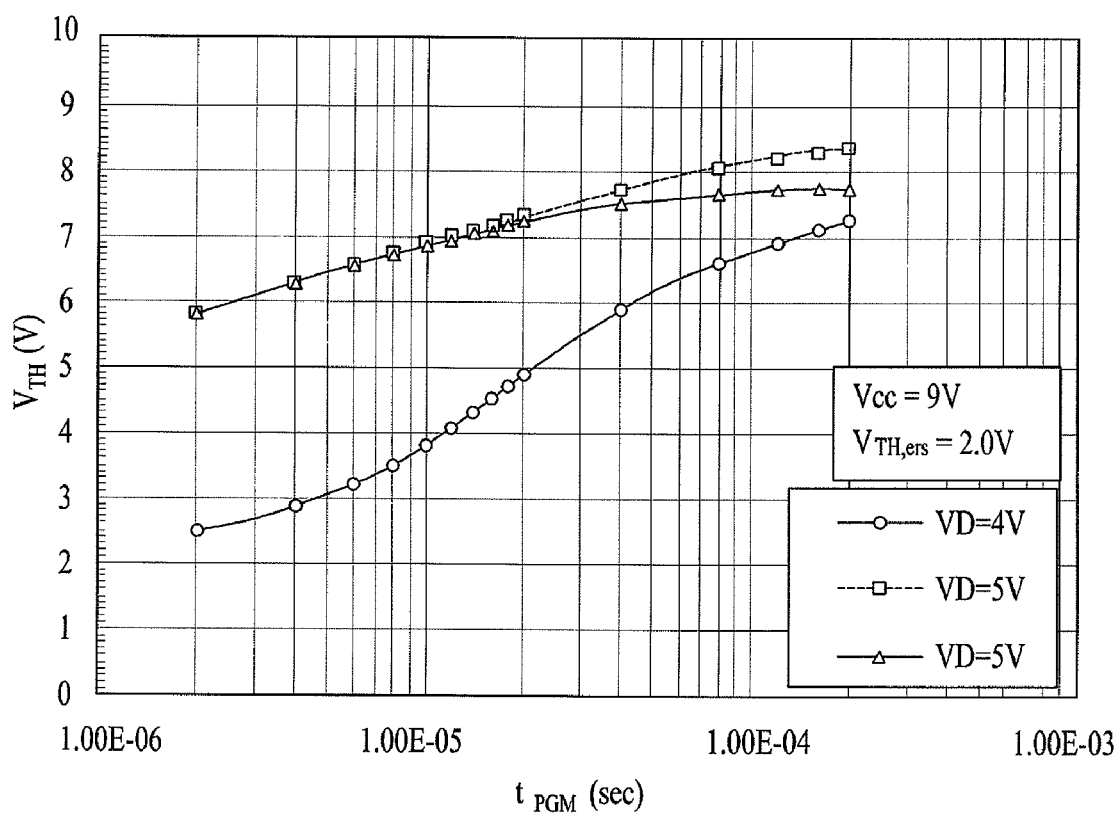

Example FIG. 6 illustrates a graph showing the change in threshold voltage according to a gate voltage and a drain voltage in a flash memory device, in accordance with embodiments.

Figure 7:
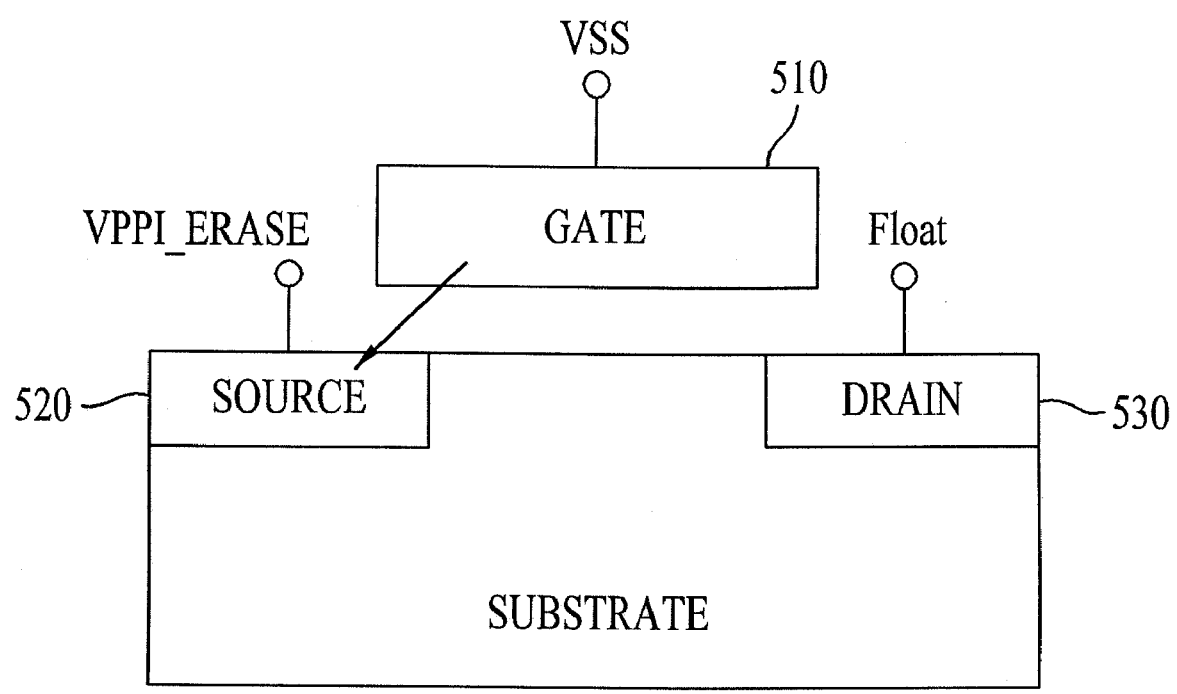

Example FIG. 7 illustrates a flash memory device in an erase state, in accordance with embodiments.

Figure 8:
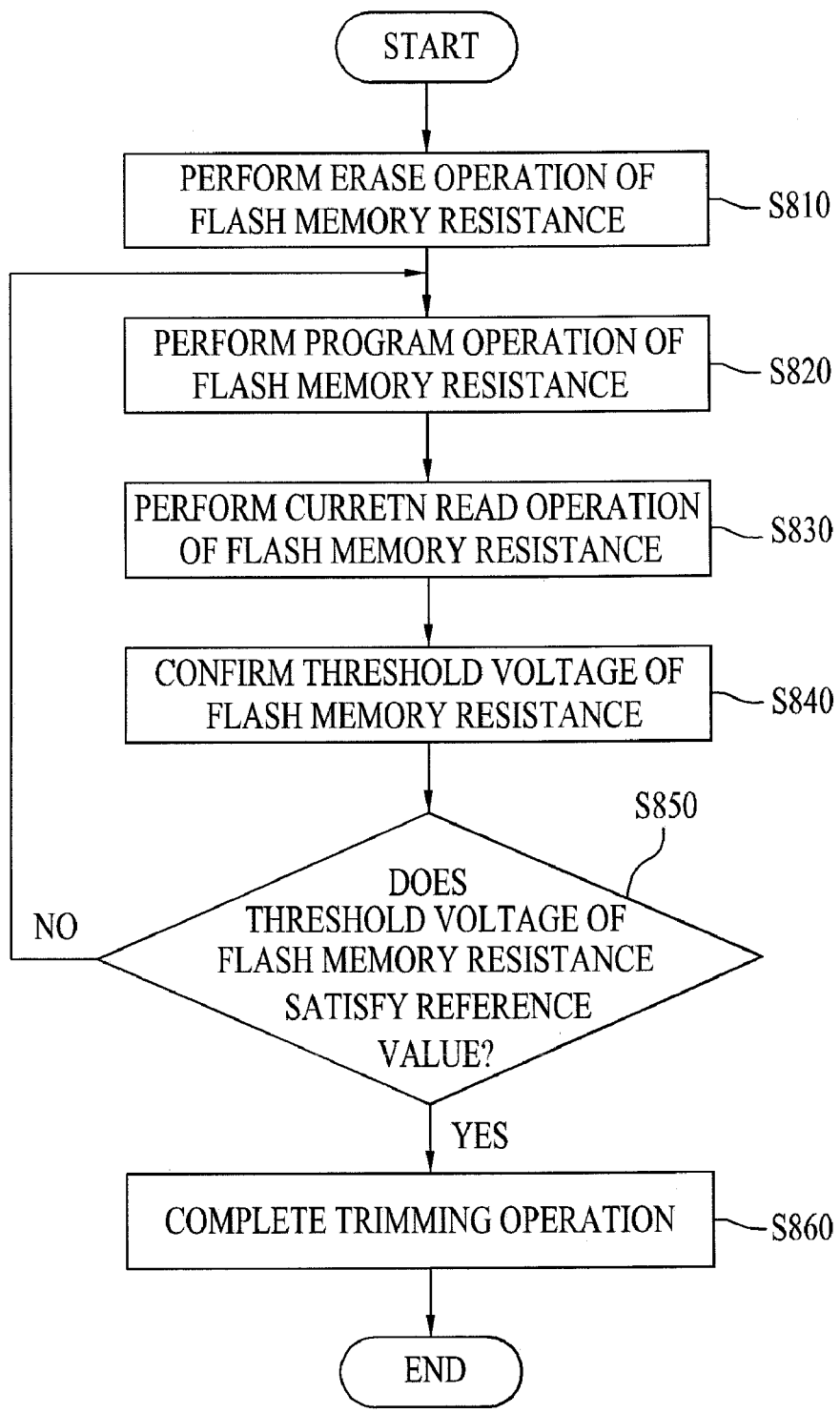

Example FIG. 8 illustrates a method for trimming the reference voltage of a flash memory device, in accordance with embodiments.

DESCRIPTION

As illustrated in example FIG. 3, a circuit for trimming a reference voltage can include resistor R1 dividing reference voltage VREF and drain voltage VDD, flash memory resistor F1 formed of a flash memory, NMOS transistor N1 turning on/off the drain of the flash memory, and amplifier AMP comparing reference voltage VREF and node voltage VNODE. Node voltage VNODE may indicate a voltage value at a point to which resistor R1, flash memory resistor F1, and amplifier AMP are connected.

As illustrated in example FIG. 4, a peripheral apparatus of the circuit for trimming the reference voltage of the flash memory device can include NMOS gate switch 410 turning on/off NMOS transistor N1 according to a flash EN_input signal for controlling NMOS gate switch 410. Flash cell gate switch 420 can switch the gate voltage of the flash memory when the flash memory is in program, erase, and/or resistance states, according to an PGM_EN input signal and ERA- SE_EN input signal for controlling flash cell gate switch 420 and high voltage VPPI_PGM required for the program operation of the flash memory. Flash cell source switch 430 can switch the source voltage of the flash memory for the erase operation of the flash memory according to ERASE_EN input signal for controlling flash cell source switch 430 and high voltage VPPI_ERASE required for the erase operation of the flash memory. Flash cell drain switch 440 can switch the drain voltage of the flash memory for the program operation of the flash memory according to PGM_EN input signal for controlling flash cell drain switch 440 in the program state of the flash memory and READ_EN input signal for controlling READ_EN input signal for controlling flash cell drain switch 440 in the read state of the flash memory.

As illustrated in example FIG. 5, a flash memory device in an operation state can operate by applying high voltage VPPI_PGM to gate 510, applying source voltage VSS to source 520, and applying drain voltage VDD to drain 530 to generate a channel hot electron injection to increase the threshold voltage of the flash memory.

As illustrated in example FIG. 6, when a high voltage $V_{CG}$ of 9V is applied to gate 510 and drain voltages VD of 4V, 5V and 6V is applied to drain 530, the rise of the threshold voltage is shown relative to time. Accordingly, gate voltage $V_{CG}$ and drain voltage VD can be input to conform to the characteristics of the flash memory when operating the program of the flash memory so that the threshold voltage of the flash memory can be changed. Thereby, trimming operations can be conducted having a desired threshold voltage value in the flash memory.

As illustrated in example FIG. 7, a flash memory device in an erase state can operate by floating drain 530, applying source voltage VSS to gate 510, and applying high voltage VPPI_ERASE to source 520 to generate FN tunneling, thereby reducing the threshold voltage of the flash memory.

As illustrated in example FIGS. 4 and 8, a method for trimming the reference voltage of a flash memory device in accordance with embodiments may include step S810 of performing an erase operation of flash memory resistor F1 after selecting a chip intending to test a produced wafer (S810).

The erase operation may be performed as follows. When flash memory resistor F1 is in an erase state, Flash_EN input signal can be input to NMOS gate switch 410 to output source voltage VSS to second node ND2 so that NMOS transistor N1 is turned off. Moreover, ERASE_EN input signal can be input to flash cell gate switch 420 to output source voltage VSS to third node ND3 so that the source voltage can be applied to the gate of the flash memory. ERASE_EN input signal can be applied to flash cell source switch 430 to apply high voltage VPPI_ERASE to the source of the flash memory.

After completion of step S810, i.e., upon completion of the erase operation of flash memory resistor F1, flash memory resistor F1 may perform step S820, i.e., a program operation.

The program operation may be performed as follows. When flash memory resistor F1 is in a program state, Flash_EN input signal can be input to NMOS gate switch 410 to output source voltage VSS to second node ND2, thereby turning off NMOS transistor N1. PGM_EN input signal can be also applied to flash cell gate switch 420 to output high voltage VPPI_PGM to third node ND3 so that high voltage VPP_PGM can be applied to the gate of the flash memory. ERASE_EN input signal input to flash cell source switch 430 can be disabled to apply source voltage VSS to the source of the flash memory and PGM_EN input signal can be input to flash cell drain switch 440 to output drain voltage VDD to first node ND1 so that drain voltage VDD is applied to the drain of the flash memory.

After completion of step S820, i.e., upon completion of the program operation of flash memory resistor F1, flash memory resistor F1 may perform step S830, i.e., a current read operation.

The current read operation may be performed as follows. When the flash memory is in a current read state, Flash_EN input signal can be input to NMOS gate switch 410 to output source voltage VSS to second node ND2, thereby turning off NMOS transistor N1. PGM_EN input signal input to flash cell gate switch 420 can also be disabled to output drain voltage VDD to the third node ND3 so that drain voltage VDD can be applied to the drain of the flash memory. ERASE_EN input signal input to flash cell source switch 430 can also be disabled to apply source voltage VSS to the source of the flash memory and READ_EN input signal can be input to flash cell drain switch 440 to output drain voltage VDD to first node ND1 so that drain voltage VDD can be applied to the drain of the flash memory.

After completion of step S830, i.e., upon completion of the current read operation of flash memory resistor F1, the threshold voltage of flash memory resistor F1 can be confirmed in step S840 by measuring the current flowing into the drain of flash memory resistor F1.

When performing confirmation step S840, a determination is made in step S850 whether the threshold voltage of flash memory resistor F1 satisfies the reference voltage. If the threshold voltage of flash memory resistor F1 satisfies the reference voltage, the trimming operation is completed in step S860. As a result, the flash memory can be used as the resistor. If, however, the confirmed threshold voltage does not satisfy the reference voltage in the current read state of the flash memory, the program operation of the flash memory (i.e., step S820) and the current read operation of the flash memory (i.e., step S830) are repeatedly performed so that the threshold voltage conforms to the reference voltage.

In accordance with embodiments, a method and apparatus for trimming a reference voltage of a flash memory device is provided extending numerous advantages. For instance, use of a flash memory as a resistor so that a resistor insensitive to the change in drain voltage and process conditions in a semiconductor process can enhance the precision of the resistor and conform an optimal resistance value to the characteristics for every chip. Because a metal option is not utilized, separate mask manufacturing cost is not required, thereby reducing overall development costs. Separate testing or the use of a laser cutting apparatus due to the use of the fuse can be avoided. Flexibility of production can be enhanced by effectively coping with the demand of the rework of the trimming after completing the trimming work. The overall number of chips produced per unit area can be increased by reducing the area of a resistor that heretofore, occupied a considerable portion of the chip size in order to make a resistor with a large value.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
a circuit for trimming a reference voltage including a resistor dividing a drain voltage, a flash memory resistor including a flash memory, an NMOS transistor turning on/off a drain of the flash memory, and an amplifier comparing the reference voltage and a node voltage, wherein the resistor includes one end connected to a V node, the NMOS transistor has a drain connected to the V node and a source connected to the drain of the flash memory, the flash memory includes the drain connected to the source of the NMOS transistor, a source connected to a system voltage, and a gate connected to a drain voltage, and the amplifier is connected to the V node to receive the node voltage;
an NMOS gate switch turning on/off the NMOS transistor;
a flash cell gate switch switching the gate voltage of the flash memory when the flash memory is in at least one of program, erase, and resistance states;
a flash cell source switch switching a source voltage of the flash memory for the erase operation of the flash memory; and
a flash cell drain switch switching the drain voltage of the flash memory for the program operation of the flash memory.

2. The apparatus of claim 1, wherein the node voltage is a voltage value at the V node to which the resistor, the flash memory resistor, and the amplifier are connected.

3. The apparatus of claim 1, wherein the NMOS gate switch turns on/off the NMOS transistor according to a Flash_EN input signal for controlling the NMOS gate switch.

4. The apparatus of claim 1, wherein the flash cell gate switch switches the gate voltage of the flash memory when the flash memory is in at least one of program, erase, and resistance states, according to a PGM_EN input signal and an ERASE_EN input signal for controlling the flash cell gate switch and a voltage required for the program operation of the flash memory.

5. The apparatus of claim 1, wherein the flash cell source switch switches the source voltage of the flash memory for the erase operation of the flash memory according to the ERASE_EN input signal for controlling the flash cell source switch and the voltage required for the erase operation of the flash memory.

6. The apparatus of claim 1, wherein the flash cell drain switch switches the drain voltage of the flash memory for the program operation of the flash memory according to the PGM_EN input signal for controlling the flash cell drain switch in the program state of the flash memory and the READ_EN input signal for controlling the flash cell drain switch in the read state of the flash memory.

7. A method comprising:
performing an erase operation of a flash memory resistor including a flash memory in a circuit for trimming a reference voltage, wherein the flash memory includes a drain connected to a source of a NMOS transistor, a source connected to a system voltage, and a gate connected to a drain voltage;
performing a program operation of the flash memory resistor;
performing a current read operation of the flash memory resistor;
confirming the threshold voltage of the flash memory resistor by measuring the current flowing into a drain of the flash memory resistor;
determining whether the threshold voltage of the flash memory resistor satisfies a reference voltage; and then
completing the trimming operation if the threshold voltage of the flash memory resistor satisfies the reference voltage.

8. The method of claim 7, wherein if the threshold voltage of the flash memory resistor does not satisfy the reference voltage, sequentially repeating the steps of performing a program operation of the flash memory resistor, performing a current read operation of the flash memory resistor and confirming the threshold voltage of the flash memory resistor.

9. The method of claim 7, wherein performing the erase operation comprises inputting a Flash_EN input signal to an NMOS gate switch to output a source voltage to a second node so that a NMOS transistor is turned off.

10. The method of claim 9, wherein performing the erase operation comprises inputting an ERASE_EN input signal to a flash cell gate switch to output the source voltage to a third node so that the source voltage is applied to a gate of the flash memory.

11. The method of claim 10, wherein performing the erase operation comprises inputting the ERASE_EN input signal to a flash cell source switch to apply a voltage to a source of the flash memory.

12. The method of claim 7, wherein performing the program operation comprises inputting a Flash_EN input signal to an NMOS gate switch to output a source voltage to a second node so that an NMOS transistor is turned off.

13. The method of claim 12, wherein performing the program operation comprises inputting a PGM_EN input signal to a flash cell gate switch to output a voltage to a third node so that the voltage is applied to a gate of the flash memory.

14. The method of claim 13, wherein performing the program operation comprises disabling an ERASE_EN input signal input to a flash cell source switch to apply the source voltage to a source of the flash memory.

15. The method of claim 14, wherein performing the program operation comprises inputting the PGM_EN input signal to a flash cell drain switch to output a drain voltage to a first node so that the drain voltage is applied to a drain of the flash memory.

16. The method of claim 7, wherein performing the current read operation comprises inputting a flash_FN input signal to an NMOS gate switch to output a source voltage to a second node so that an NMOS transistor is turned-off.

17. The method of claim 16, wherein performing the current read operation comprises disabling a PGM_EN input signal input to a flash cell gate switch to output a drain voltage to a third node so that a drain voltage is applied to a gate of the flash memory.

18. The method of claim 17, wherein performing the current read operation comprises disabling an ERASE_EN input signal input to a flash cell source switch to apply the source voltage to a source of the flash memory.

19. The method of claim 18, wherein performing the current read operation comprises outputting a READ_EN input signal to a flash cell drain switch to output the drain voltage to a first node so that the drain voltage is applied to the drain of the flash memory.

* * * * *